(12) United States Patent
Henrion et al.

(10) Patent No.: US 8,832,508 B2
(45) Date of Patent: Sep. 9, 2014

(54) APPARATUS AND METHODS FOR TESTING WRITABILITY AND READABILITY OF MEMORY CELL ARRAYS

(75) Inventors: Carson Henrion, Ft. Collins, CO (US); Michael Dreesen, Timnath, CO (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 815 days.

(21) Appl. No.: 12/949,574

(22) Filed: Nov. 18, 2010

(65) Prior Publication Data

US 2012/0131399 A1    May 24, 2012

(51) Int. Cl.
| G11C 29/04 | (2006.01) |
| G11C 7/10 | (2006.01) |
| G11C 29/26 | (2006.01) |
| G11C 29/56 | (2006.01) |

(52) U.S. Cl.
CPC .............. *G11C 7/1069* (2013.01); *G11C 29/56* (2013.01); *G11C 7/1096* (2013.01); *G11C 29/26* (2013.01); *G11C 2029/2602* (2013.01); *G11C 2029/0401* (2013.01)
USPC ....... 714/718; 714/719; 714/722; 365/230.02

(58) Field of Classification Search
USPC .......... 714/718, 719, 722; 365/230.02, 230.03
See application file for complete search history.

(56) References Cited

U.S. PATENT DOCUMENTS

| 5,400,342 | A | * | 3/1995 | Matsumura et al. .......... 714/719 |
| 5,740,179 | A | * | 4/1998 | Dorney et al. ................ 714/719 |
| 5,870,341 | A | * | 2/1999 | Lin et al. ...................... 365/200 |
| 5,903,575 | A | * | 5/1999 | Kikuda ......................... 714/719 |
| 6,064,601 | A | * | 5/2000 | Yoo et al. .................. 365/189.04 |
| 6,144,597 | A | * | 11/2000 | Kim .............................. 365/201 |
| 6,333,872 | B1 | * | 12/2001 | Ouellette et al. ......... 365/189.06 |
| 6,510,098 | B1 | * | 1/2003 | Taylor ..................... 365/230.05 |
| 6,826,652 | B1 | * | 11/2004 | Chauvel et al. ............... 711/128 |
| 7,240,253 | B2 | * | 7/2007 | Yoshida et al. ............... 714/718 |

OTHER PUBLICATIONS

Wikipedia's Static Random-Access Memory version from Nov. 17, 2010 http://en.wikipedia.org/w/index.php?title=Static_random-access_memory&oldid=397285991.*
Wuu, J., et al. "The Asynchronous 24MB On-Chip Level-3 Cache for a Dual-Core Itanium-Family Processor," ISSCC, Session 26—Static Memory, Feb. 9, 2005. pp. 488-489, 618.
Dorsey, J., et al. "An Integrated Quad-Core Opteron Processor," ISSCC, Session 5—Microprocessors, Feb. 12, 2007. pp. 102-103.
Wang, Y., et al. "A 4.0 GHz 291Mb Voltage-Scalable SRAM Design in 32nm High-k Metal-Gate CMOS with Integrated Power Management," ISSCC, Session 27—SRAM and Emerging Memory, Feb. 11, 2009. pp. 456-458.

* cited by examiner

*Primary Examiner* — Joseph Schell
(74) *Attorney, Agent, or Firm* — Mahamedi Paradice LLP

(57) ABSTRACT

Apparatus and methods are provided for concurrently selecting multiple arrays of memory cells when accessing a memory element. A memory element includes a first array of one or more memory cells coupled to a first bit line node, a second array of one or more memory cells coupled to a second bit line node, access circuitry for accessing a first memory cell in the first array, a first transistor coupled between the first bit line node and the access circuitry, and a second transistor coupled between the second bit line node and the access circuitry. A controller is coupled to the first transistor and the second transistor, and the controller is configured to concurrently activate the first transistor and the second transistor to access the first memory cell in the first array.

11 Claims, 4 Drawing Sheets

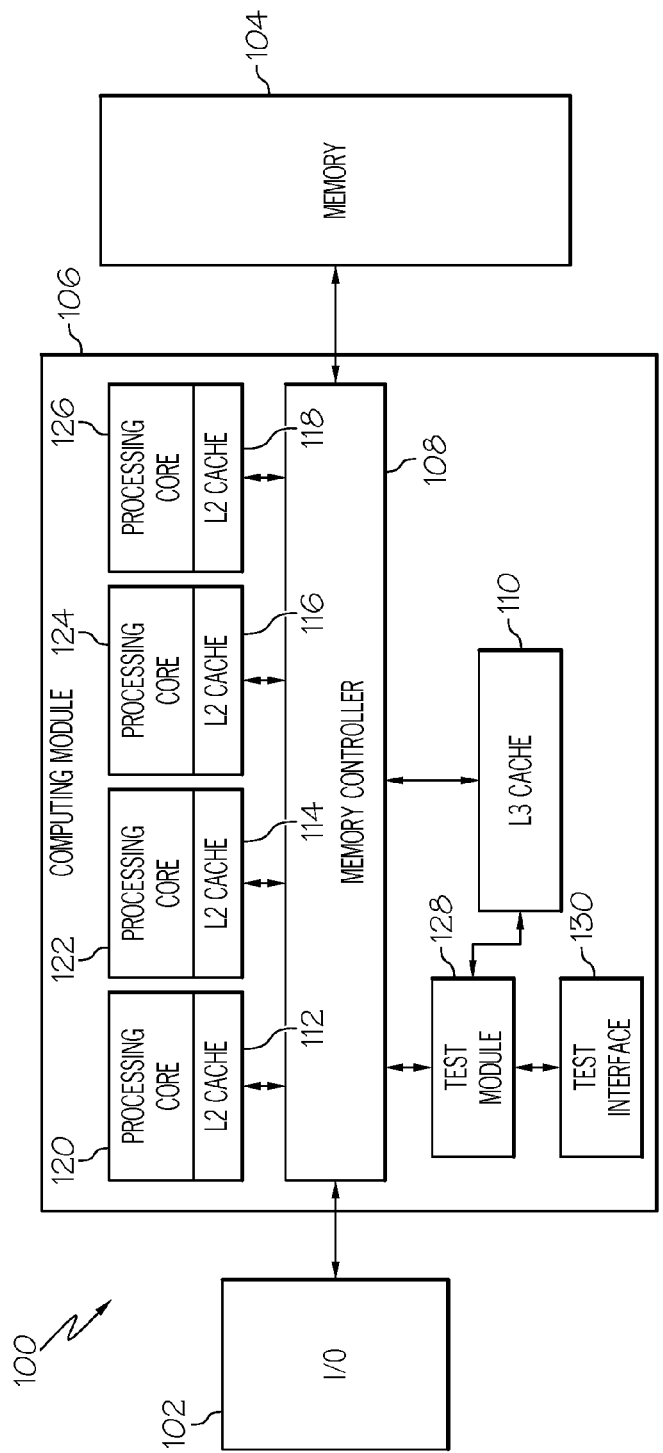
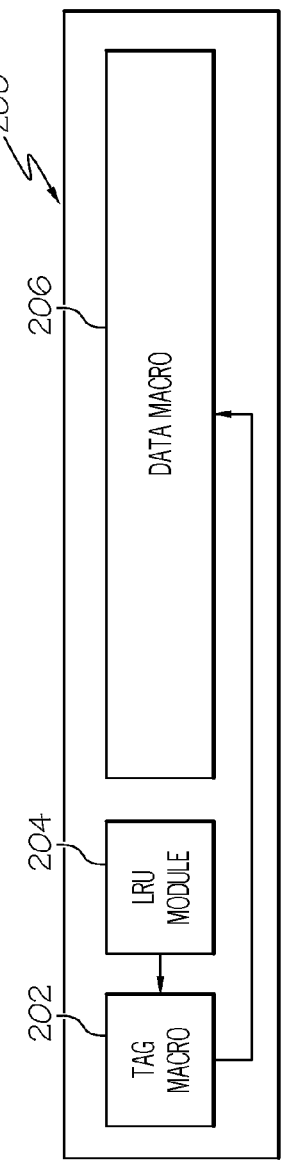

APPARATUS AND METHODS FOR TESTING WRITABILITY AND READABILITY OF MEMORY CELL ARRAYS

TECHNICAL FIELD

Embodiments of the subject matter described herein relate generally to electronic circuits, and more particularly, relate to memory elements for use in computing devices and methods for testing the same.

BACKGROUND

Memory elements are widely used in computing applications. For example, a typical computing device may include a combination of volatile and non-volatile memory elements to maintain data, program instructions, and the like that are accessed by a processing unit (e.g., a CPU) during operation of the computing device. Latencies associated with memory accesses impair performance of the computing device. Accordingly, a processing unit typically includes one or more memory elements, known as caches, to provide requested data or instructions to the processing unit with reduced latency. Typically, caches are realized as volatile memory elements. For example, an array of static random access memory (SRAM) cells may be used to provide a cache on a common die with the processing unit.

In practice, process, temperature, and voltage (PVT) variations may affect the ability of one or more SRAM cells to be written to and/or read from within a specified timing margin and/or voltage margin. Furthermore, as the size of the components of the SRAM cells decreases, the relative variations across the array of SRAM cells increase. Additionally, component degradation, such as negative bias temperature instability (NBTI), may impact long-term reliability of the SRAM cells and/or the peripheral circuitry utilized to access the SRAM cells.

BRIEF SUMMARY

In general, an apparatus for a memory element is provided. The memory element includes a first array of one or more memory cells coupled to a first bit line node, a second array of one or more memory cells coupled to a second bit line node, access circuitry for accessing a first memory cell in the first array, a first transistor coupled between the first bit line node and the access circuitry, and a second transistor coupled between the second bit line node and the access circuitry. A controller is coupled to the first transistor and the second transistor, and the controller is configured to concurrently activate the first transistor and the second transistor to access the first memory cell in the first array.

In one embodiment, an apparatus for an electronic device is provided. The electronic device includes a memory element including an array of memory cells having a plurality of columns and a control module coupled to the memory element. In response to identifying a test mode, the control module and the memory element are cooperatively configured to concurrently select at least two of the plurality of columns while accessing the array.

In another embodiment, a method is provided for testing a memory element including an array of memory cells having a first column of memory cells and a second column of memory cells. The method comprises the steps of concurrently selecting the first column of the array and the second column of the array while accessing a first memory cell in the first column of the array and validating the first memory cell when a stored data value of the first memory cell matches an input data value for the first memory cell.

This summary is provided to introduce a selection of concepts in a simplified form that are further described in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 1 is a block diagram of a computing system in accordance with one embodiment;

FIG. 2 is a block diagram of a cache memory element suitable for use in the system of FIG. 1 in accordance with one embodiment;

DETAILED DESCRIPTION

Figure 3:
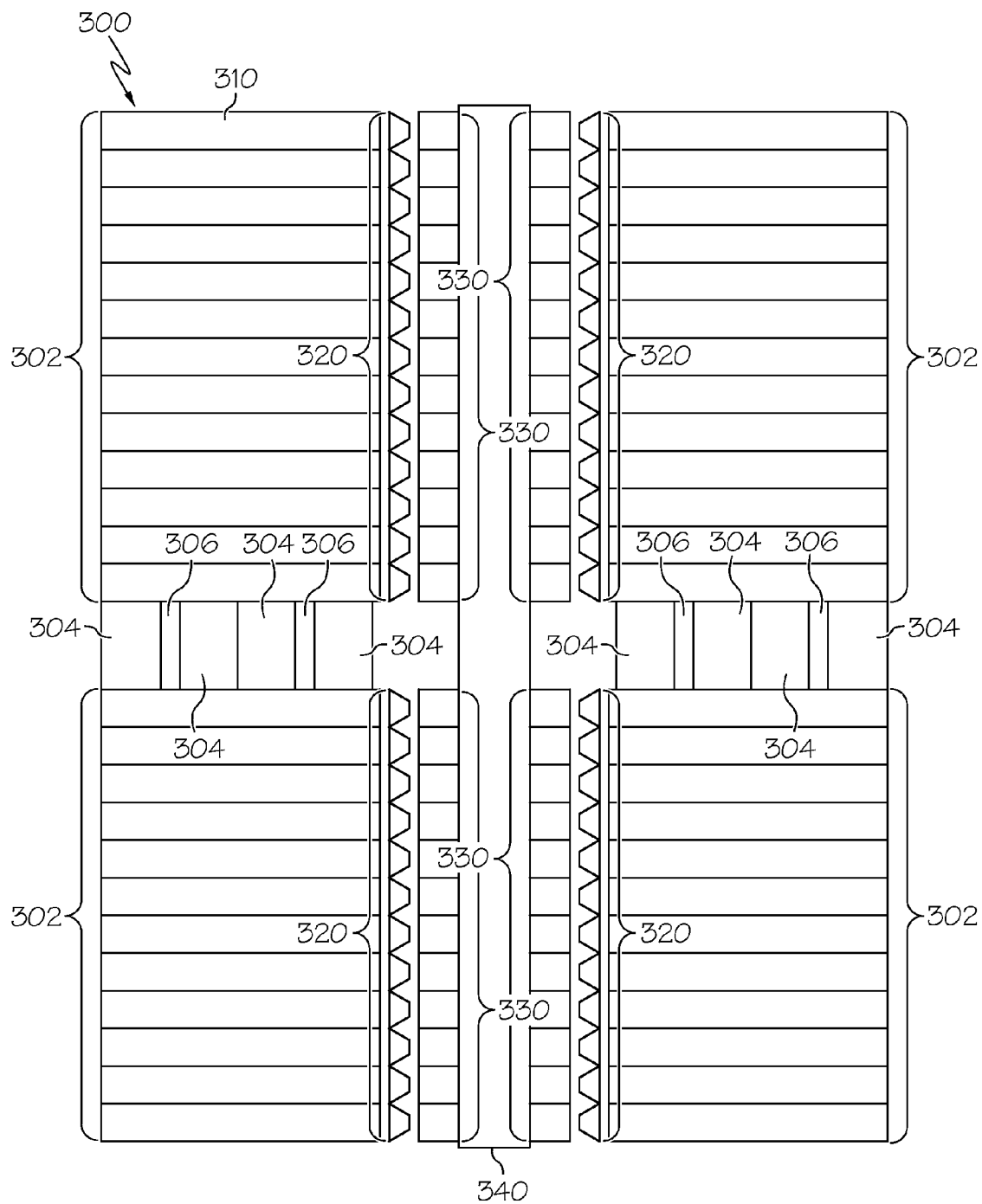
FIG. 3 is a block diagram of a way memory element suitable for use in the cache memory element of FIG. 2 in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Technologies and concepts discussed herein relate to memory elements for use in computing modules and related methods for testing the memory cells and/or peripheral circuits of memory elements by concurrently selecting or otherwise enabling multiple columns (or arrays) of a memory element while writing and/or reading data to memory cells of the memory element. For example, as described in greater detail below, in one embodiment, to test writability, a computing module includes a test control module and memory controller cooperatively configured to write an input data pattern to an array of memory cells inside a memory element while concurrently selecting at least two columns of the array and read an output data pattern from the array of memory cells while concurrently selecting at least two columns of the array. The writability of the array of memory cells is validated when the output data pattern matches the input data pattern. When the output data pattern does not match the input data pattern, the array of memory cells may be bypassed, disabled, or repaired within the memory element. In some embodiments, to test readability, the hold margin of the sense amplifier may be tested by concurrently selecting at least two columns of the array while reading an output data pattern, as described in greater detail below.

FIG. 1 depicts an exemplary embodiment of a computing system 100. The computing system 100 includes, without limitation, one or more input/output (I/O) peripherals 102, memory 104, and an electronic device 106, such as a computing module (e.g., a processor, central processing unit (CPU), graphics processing unit (GPU), or the like). In an exemplary embodiment, the computing module 106 includes a memory controller 108 (or northbridge) configured to interface with the I/O peripherals 102 and the memory 104, a plurality of cache memory elements (or caches) 110, 112, 114, 116, 118, a plurality of processing cores 120, 122, 124, 126, a test control module 128, and a test interface 130. It should be understood that FIG. 1 is a simplified representation of a computing system 100 for purposes of explanation and ease of description, and FIG. 1 is not intended to limit the subject matter in any way. Practical embodiments of the computing system 100 may include other devices and components for providing additional functions and features, and/or the computing system 100 may be part of a larger system, as will be understood.

The I/O peripherals 102 generally represent the hardware, software, and/or firmware components configured to support communications to/from the computing module 106 and one or more peripheral (or external) devices. For example, the I/O peripheral 102 may be realized as a bus or another communications interface configured to support data transmission to/from the computing module 106 in accordance with one or more data communication protocols.

The memory 104 generally represents the main memory or primary memory for the computing system 100. Depending on the embodiment, memory 104 may be realized as a hard disk, flash memory, ROM memory, RAM memory, another suitable storage medium known in the art or any suitable combination thereof. The memory 104 maintains data and/or program instructions to support operations of the computing system 100 and/or computing module 106 as will be appreciated in the art. In an exemplary embodiment, memory 104 is implemented separately from computing module 106 (e.g., on another chip and/or die), and accordingly, may be understood as being external to the computing module 106.

In an exemplary embodiment, the computing module 106 includes a memory controller 108 that is coupled to the I/O peripherals 102 and the external memory 104 and controls communications between the components of computing module 106 and the I/O peripherals 102 and/or external memory 104. The processing cores 120, 122, 124, 126 generally represent the main processing hardware, logic and/or circuitry for the computing module 106, and each processing core 120, 122, 124, 126 may be realized using one or more arithmetic logic units (ALUs), one or more floating point units (FPUs), one or more memory elements (e.g., one or more caches), discrete gate or transistor logic, discrete hardware components, or any combination thereof. Although not illustrated in FIG. 1, each processing core 120, 122, 124, 126 may implement its own associated cache memory element (e.g., a level one or L1 cache) in proximity to its respective processing circuitry for reduced latency. The caches 110, 112, 114, 116, 118 are realized as intermediary memory elements having reduced size relative to external memory 104 for temporarily storing data and/or instructions retrieved from external memory 104. In the illustrated embodiment, the computing module 106 includes a set of caches 112, 114, 116, 118 are in close proximity to and coupled between a respective processing core 120, 122, 124, 126 and the memory controller 108. In this regard, caches 112, 114, 116, 118 may be referred to as core-coupled caches, and each core-coupled cache 112, 114, 116, 118 maintains data and/or program instructions previously fetched from external memory 104 that were either previously used by and/or likely to be used by its associated processing core 120, 122, 124, 126. The caches 112, 114, 116, 118 are preferably larger than the L1 caches implemented by the processing cores 120, 122, 124, 126 and function as level two caches (or L2 caches) in the memory hierarchy. The illustrated embodiment of computing module 106 also includes another higher level cache 110 (a level three or L3 cache) that is preferably larger than the L2 caches 112, 114, 116, 118.

In an exemplary embodiment, the computing module 106 includes a test control module 128 that is coupled to a test interface 130 for the computing module 106. The test interface 130 comprises a plurality of pins dedicated for use in testing the functionality of the computing module 106. In one embodiment, the test interface 130 is compliant with the IEEE 1149.1 Standard Test Access Port and Boundary-Scan Architecture, that is, Joint Test Action Group (JTAG) standards. The test control module 128 generally represents the circuitry, logic, and/or hardware components configured to receive signals and/or bits from the test interface 130 that are indicative of a desired test mode, test data in, and the like, and in response to the signals and/or bits at the test interface 130, the test control module 128 implements the desired test mode, as described in greater detail below. In this regard, in an exemplary embodiment, the test control module 128 is coupled to the memory controller 108 and the L3 cache 110 and initiates or otherwise implements a test process 500 as described in greater detail below in the context of FIG. 5. In this regard, in an exemplary embodiment, in a write test mode, the test control module 128 and/or memory controller 108 are cooperatively configured to write an input data pattern to an array of memory cells of the L3 cache 110 while concurrently selecting at least two columns of the array, read an output data pattern from the array, and validate the array when the output data pattern matches the input data pattern. Conversely, in a read test mode, in an exemplary embodiment, the test control module 128 and/or memory controller 108 are cooperatively configured to write a zero data pattern to an array of memory cells of the L3 cache 110, read an output data pattern from the array while concurrently selecting at least two columns of the array, and validate the array when the output data pattern matches the zero data pattern, as described in greater detail below. In accordance with one embodiment, the test control module 128 identifies the test mode based on the input signals and/or bits at interface 130, and in response, instructs the memory controller 108 to enter the identified test mode, whereby the memory controller 108 automatically writes the input data pattern to the array, reads the output data pattern from the array of memory cells after writing the input data pattern to the array, and validates the array in the identified test mode. It should be noted that although FIG. 1 depicts the test control module 128 and the memory controller 108 as separate elements, in practice, the test control module 128 may be integral with the memory controller 108 or the features and/or functionality described herein in the context of the test control module 128 may alternatively be implemented by the memory controller 108.

FIG. 2 depicts an exemplary embodiment of a cache memory element 200 suitable for use in the computing system 100 of FIG. 1. In an exemplary embodiment, the L3 cache 110 is realized as cache memory element 200. The illustrated embodiment of the cache memory element 200 includes a tag memory block (or tag macro) 202, a least recently used (LRU)

module 204, and a data memory block (or data macro) 206. The data macro 206 generally represents the logical grouping of hardware and/or circuitry configured to maintain data and/or instructions previously requested or utilized by one or more of the processing cores 120, 122, 124, 126 that has been fetched from external memory 104 provided to the cache 200 (e.g., from L2 caches 112, 114, 116, 118 and/or external memory 104) by the memory controller 108. The tag macro 202 generally represents the logical grouping of hardware and/or circuitry configured to maintain tag information (e.g., a data identifier, status information, mapping information, indexing bits, error correction bits, and the like) associated with an individual portion or segment of data maintained by data macro 206. In an exemplary embodiment, the tag macro 202 includes a includes a plurality of way memory elements (or ways), wherein each way generally represents a subset of the tag macro 202 configured to store the status information and mapping information and perform additional tasks and functions, as described in greater detail below. In this regard, the cache memory element 200 comprises a set associative cache, wherein each way corresponds to a subset of the cache memory element 200 where tag information corresponding to an input address may be stored or otherwise located. The LRU module block 204 generally represents the logic, circuitry and/or other hardware configured to implement one or more algorithms to determine which entry (i.e., address or physical location) within the cache memory element 200 is least recently (or least frequently) accessed. It should be appreciated that FIG. 2 is a simplified representation of a cache memory element for purposes of explanation and ease of description, and FIG. 2 is not intended to limit the subject matter in any way.

FIG. 3 depicts an exemplary embodiment of a way memory element (or way) 300 suitable for use in the tag macro 202 of FIG. 2. In an exemplary embodiment, a way 300 includes, without limitation, a plurality of arrays of memory cells 302, word line decoders (or word line decode logic) 304, and access controllers (or access control logic) 306. In an exemplary embodiment, the memory cells are realized as static random access memory (SRAM) cells. Accordingly, for convenience, but without limitation, the arrays of memory cells 302 may alternatively be referred to herein as arrays of SRAM cells or SRAM arrays. It should be understood that FIG. 3 is a simplified representation of a way 300 for purposes of explanation and ease of description, and FIG. 3 is not intended to limit the subject matter in any way. Practical embodiments of the way 300 may include other devices and components for providing additional functions and features, as will be understood.

Each array of SRAM cells 310 is configured to provide an individual bit of data from the way 300. As described in greater detail below in the context of FIG. 4, in an exemplary embodiment, each array of SRAM cells 310 is a two-dimensional rectangular array having a first number (n) of columns of cells by a second number (m) of rows of cells. For example, in an exemplary embodiment, each array of SRAM cells 310 is eight cells vertically (e.g., 8 columns) by thirty-two cells horizontally (e.g., 32 rows). Each array of SRAM cells 310 includes column selection circuitry configured to select or otherwise enable access to (e.g., writing to and/or reading from) a particular column of cells within the respective array of SRAM cells 310 in response to signals from an associated access controller 306. In this regard, each access controller 306 is coupled one or more arrays of SRAM cells 310, and the access controllers 306 generally represent the circuitry, logic, and/or hardware components configured to select, activate, or otherwise enable the output of a particular column of cells within the respective arrays of SRAM cells 310. Each word line decoder 304 is coupled one or more arrays of SRAM cells 310, and the word line decoders 304 generally represent the circuitry, logic, and/or hardware components configured to select or otherwise enable access to (e.g., writing to and/or reading from) a particular row of cells within the arrays of SRAM cells 310. In this manner, to access (e.g., write data to or read data from) a particular SRAM cell of a first array of SRAM cells 310, its associated word line decoder 304 asserts or otherwise provides a word line select signal to enable access to the row of the array 310 containing the desired SRAM cell, and the access controller 306 associated with the array 310 asserts or otherwise provides a column select signal to enable access to the column of the array 310 including the desired SRAM cell.

In an exemplary embodiment, the way 300 includes a plurality of latching arrangements 330 corresponding to the total number of bits for an entry of the way 300. A plurality of multiplexers 320 are configured between the SRAM arrays 302 and the latching arrangements 330 to select or otherwise control which of the latching arrangements 330 the output of a respective SRAM array 310 is provided to. In an exemplary embodiment, the way 300 includes redundant SRAM arrays 310 (i.e., more SRAM arrays 310 than latching arrangements 330) to allow individual SRAM arrays 310 to be disabled or otherwise deselected by configuring the multiplexers 320 such that the output of a disabled SRAM array 310 is not provided to any of the latching arrangements 330. In this manner, an SRAM array 310 that is not validated during a test process (e.g., test process 500) may be disabled or otherwise repaired, as will be appreciated in the art and described in greater detail below in the context of FIG. 5. In the illustrated embodiment, the way 300 includes an output generation block 340 that generally represents the logic, circuitry, and/or hardware components configured to perform error correction and determine whether a particular entry in the way 300 (i.e., the outputs of the arrays of SRAM cells 302 provided to the latching arrangements 330) match or otherwise correspond to a desired item of data in the data macro 206 (i.e., a cache hit), as will be appreciated in the art.

Figure 4:
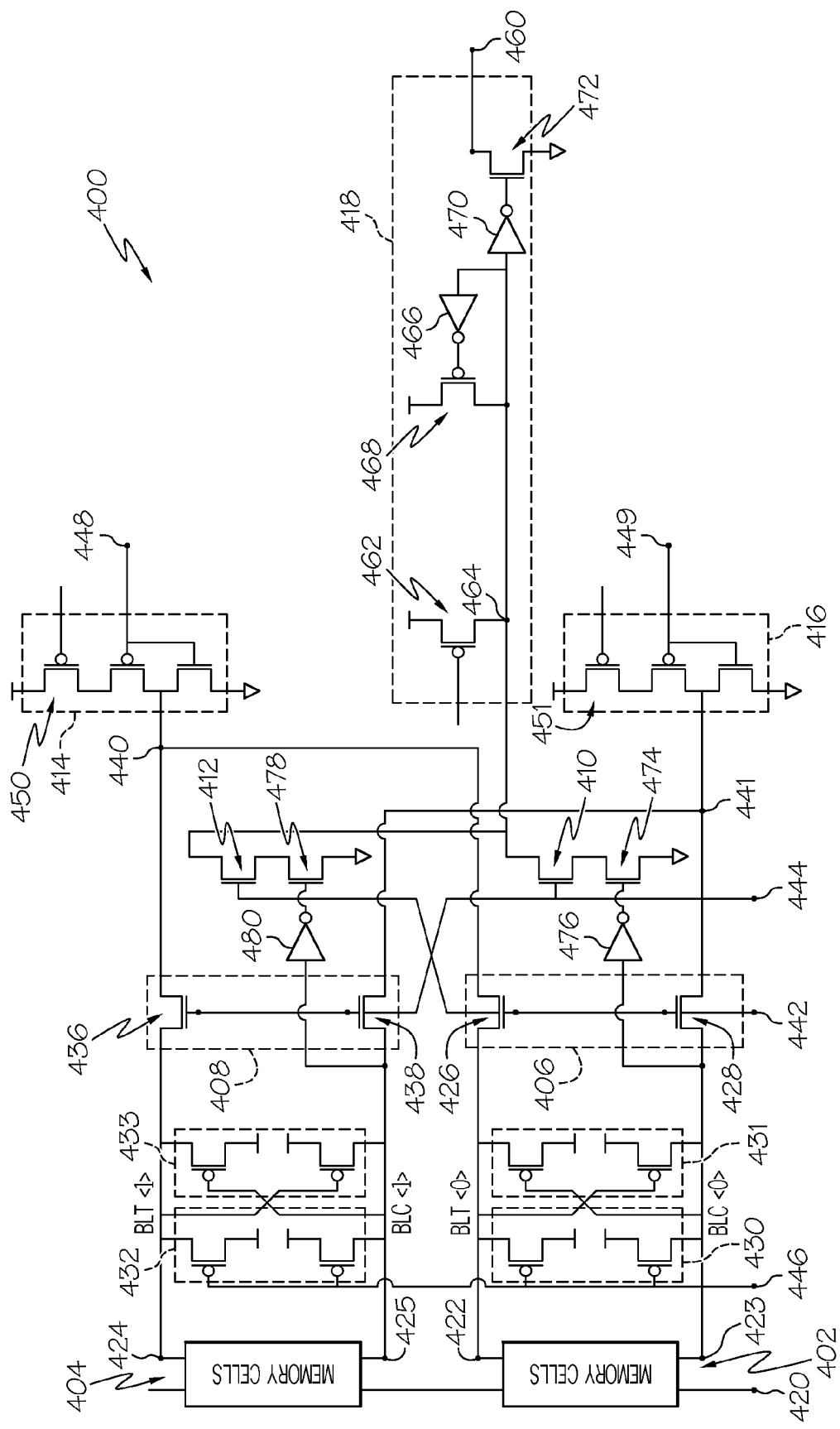
FIG. 4 is a schematic view of an array of memory elements suitable for use in the way memory element of FIG. 3 in accordance with one embodiment.

FIG. 4 depicts an exemplary embodiment of an array of memory cells 400 suitable for use as one array of memory cells (e.g., array 310) in the way 300 of FIG. 3. As set forth above, in an exemplary embodiment, the memory cells are realized as static random access memory (SRAM) cells, and accordingly, for convenience, the array of memory cells 400 may alternatively be referred to herein as an array of SRAM cells or an SRAM array. It should be understood that FIG. 4 is a simplified representation of an array of SRAM cells 400 for purposes of explanation and ease of description, and FIG. 4 is not intended to limit the subject matter in any way. In this regard, although FIG. 4 depicts an SRAM array 400 having only two columns of SRAM cells, practical embodiments of the SRAM array 400 will have more columns of SRAM cells (e.g., 8 columns as described above in the context of FIG. 3), and the subject matter is not intended to be limited to any particular number of columns of SRAM cells in an SRAM array. Furthermore, although the subject matter may be described herein in the context of an SRAM array inside a way of a tag macro, the subject matter is not intended to be limited to a particular implementation, and may be utilized in any memory element having an array of memory cells. Additionally, the subject matter is not intended to be limited to use with SRAM cells, and practical embodiments may utilize other suitable memory cells (e.g., dynamic random access memory (DRAM) cells) to perform the functions, tasks and/or operations described herein in an equivalent manner.

As described above, an array of SRAM cells 400 includes a plurality of columns of SRAM cells 402, 404, write column selection circuitry 406, 408 associated with each respective column of SRAM cells 402, 404, read column selection circuitry 410, 412 associated with each respective column of SRAM cells 402, 404, and access circuitry including write driver circuitry 414, 416 and sense amplifier circuitry 418. The write driver circuitry 414, 416 is configured to support writing input data bit values to the SRAM cells 402, 404 and the sense amplifier circuitry 418 configured to support reading output data bit values from the SRAM cells 402, 404, as described in greater detail below. It should be noted that although the subject matter may be described herein in the context of a full-swing sense amplifier implementation, the subject matter is not intended to be limited to any particular sensing scheme, and may be implemented in conjunction with small-signal sensing schemes or other suitable sensing schemes known in the art.

In FIG. 4, each column of SRAM cells 402, 404 represents a one dimensional array of SRAM cells having the number of SRAM cells corresponding to the number of rows in the SRAM array 400. For example, as described above in the context of FIG. 3, in one embodiment, each column of SRAM cells 402, 404 includes 32 SRAM cells corresponding to the number of rows of SRAM cells in the array 400. In this regard, a each column 402, 404 includes m number of SRAM cells that are selectable in response to word line signals at node 420 asserted by the word line decoder 304 associated with the SRAM array 400 as described above in the context of FIG. 3. Each SRAM cell of the first column 402 is coupled to a pair of bit line nodes 422, 423 that are associated with or otherwise correspond to the first column 402. The first bit line node 422 corresponds to a bit line true value (BLT<0>) being written to and/or read from an SRAM cell of the first column of SRAM cells 402 and the second bit line node 423 corresponds to a bit line complement value (BLC<0>) representing the logical inverse of the bit line true value. In a similar manner, each SRAM cell of the second column 404 is coupled to a pair of bit line nodes 424, 425 that are associated with or otherwise correspond to the second column 404, wherein bit line node 424 corresponds to a bit line true value (BLT<1>) being written to and/or read from an SRAM cell of the second column 404 and the second bit line node 423 corresponds to a bit line complement value (BLC<1>). In this regard, the first column of cells 402 and the second column of cells 404 are mutually exclusive, that is, a memory cell in the first column 402 (or a memory cell coupled to bit line nodes 422, 423) is not in the second column 404 (or coupled to bit line nodes 424, 425) and vice versa.

The write column selection circuitry 406, 408 generally represents the circuitry and/or logic configured to select, enable, or otherwise allow its associated column of SRAM cells 402, 404 to be written to by write driver circuitry 414, 416, as described in greater detail below. In an exemplary embodiment, the first write column selection circuitry 406 includes a first column select write transistor 426 configured between the output of the first write driver circuitry 414 at node 440 and bit line node 422 and a second column select write transistor 428 configured between the output of the second write driver circuitry 416 at node 441 and a second bit line node 423. In the illustrated embodiment, the column select write transistors 426, 428 are realized as n-type (or NMOS) transistors having their respective drain terminals connected to nodes 440, 441 and the source terminals connected to nodes 422, 423. The control (or gate) terminals of the column select write transistors 426, 428 are coupled to a node 442 configured to receive a first column select signal asserted by the access controller 306 associated with the SRAM array 400. As described in greater detail below, to write data to the first column of SRAM cells 402, the access controller 306 asserts or otherwise provides a logical high column select signal at node 442, and in response, the column select write transistors 426, 428 are turned on and conduct current to provide the respective voltages corresponding to the data values being written by write driver circuitry 414, 416 from nodes 440, 441 to nodes 422, 423, respectively. Similarly, the second write column selection circuitry 408 includes a column select write transistor 436 configured between the output of the first write driver circuitry 414 at node 440 and bit line node 424 and a column select write transistor 438 configured between the output of the second write driver circuitry 416 at node 441 and bit line node 425. The control (or gate) terminals of the column select write transistors 436, 438 are coupled to a node 444 configured to receive a second column select signal asserted by the access controller 306 associated with the SRAM array 400. In this regard, to write data to the second column of SRAM cells 404, the access controller 306 asserts or otherwise provides a logical high column select signal at node 444, and in response, the column select write transistors 436, 438 are turned on and conduct current to provide the respective voltages corresponding to the data values being written by write driver circuitry 414, 416 from nodes 440, 441 to nodes 424, 425, respectively.

In an exemplary embodiment, the columns of SRAM cells 402, 404 are aliased such that they share a column select signal. For example, in the illustrated embodiment, the first column select signal may be asserted at node 442 to either write data to the first column 402 or read data from the second column 404, or conversely, the second column select signal may be asserted at node 444 to either write data to the second column 404 or read data from the first column 402. In the illustrated embodiment, the read column selection circuitry 410 associated with the first column 402 is realized as an NMOS transistor 410 having its control terminal coupled to node 444 and its drain terminal coupled to a sense amplifier multiplexing input node 464. The source terminal of the NMOS transistor 410 is coupled to the drain terminal of a pull-down transistor 474, wherein the source terminal of the transistor 474 is coupled to a ground reference voltage potential. A control terminal of the transistor 474 is coupled to the output of an inverter 476 having its input coupled to bit line node 423. In this manner, to read data from the first column 402, the access controller 306 asserts or otherwise provides a logical high column select signal at node 444 to turn on the read transistor 410, which in turn, allows the transistor 474 to pull-down the voltage at the sense amplifier multiplexing input node 464 based on the stored data value (e.g., the voltage indicative of a stored data bit value) at bit line node 423. In this manner, a selected memory cell of the first column 402 (e.g., based on the word line select signals at node 420) influences the voltage at the sense amplifier multiplexing input node 464, and thereby influences the output data bit and/or voltage at the output node 460 while the column select signal at node 444 is asserted. However, as noted above, the logical high column select signal at node 444 will also result in the column select write transistors 436, 438 for the second column 404 being concurrently turned on or otherwise activated. In this regard, in response to a read instruction corresponding to a memory cell in the first column 402, the access controller 306 disables or otherwise tri-states the write driver circuitry 414, 416 (e.g., by providing signals to turn off transistors 450, 451) while asserting the logical high column select signal at node 444 to prevent writing data to the second column 404 while reading data from the addressed memory cell in the first column 402.

In a similar manner, the read column selection circuitry 412 associated with the second column 404 is realized as an NMOS transistor 412 having its control terminal coupled to node 442 and its drain terminal coupled to the sense amplifier multiplexing input node 464. The source terminal of the NMOS transistor 412 is coupled to the drain terminal of a pull-down transistor 478, wherein the source terminal of the transistor 478 is coupled to a ground reference voltage potential and a control terminal of the transistor 478 is coupled to the output of an inverter 480 having its input coupled to bit line node 425. To read data from the second column 404, the access controller 306 asserts or otherwise provides a logical high column select signal at node 442 to turn on the read transistor 412, which in turn, allows the transistor 478 to pull-down the voltage at the sense amplifier multiplexing input node 464 based on the stored data value (e.g., the voltage indicative of a stored data bit value) at bit line node 425. However, as noted above, the logical high column select signal at node 442 will also result in the column select write transistors 426, 428 for the first column 402 being turned on. Thus, in response to a read instruction corresponding to a memory cell in the second column 404, the access controller 306 disables or otherwise tri-states the write driver circuitry 414, 416 while asserting a logical high column select signal at node 442 to prevent writing data to the first column 402 while reading data from the second column 404, as described in greater detail below. It should be appreciated that although the subject matter may be described herein in the context of an array having aliased columns of memory cells, the subject matter is not intended to be limited to use with arrays having aliased columns of memory cells.

In the illustrated embodiment, the first write driver circuitry 414 is realized as a partial tri-state driver having its data input coupled to a first data bit input node 448 and its output coupled to the bit line true column select transistors 426, 436 at node 440. The first write driver circuitry 414 includes a transistor 450 configured to allow the access controller 306 to either enable the functionality of the write driver circuitry 414 when writing data or disable functionality of the write driver circuitry 414 when reading data, as set forth above. In this regard, in response to receiving a write instruction (e.g., from memory controller 108 and/or test control module 128), the access controller 306 associated with the SRAM array 400 provides a logical low read enable signal to the control terminal of transistor 450 to turn on transistor 450 and enable the write driver circuitry 414, thereby allowing the data bit value (or voltage) at the data bit input node 448 to influence the voltage at node 440. In a similar manner, the data input for the second write driver circuitry 416 is coupled to a second data bit input node 449, and the output of the second write driver circuitry 416 is coupled to the bit line complement column select transistors 428, 438 at node 441. The second write driver circuitry 416 also includes a transistor 451 configured to enable the functionality of the write driver circuitry 416 when writing data and disable functionality of the write driver circuitry 416 when reading data. In an exemplary embodiment, the test control module 128 and/or memory controller 108 provides voltages indicative of complementary data bit values to the data input nodes 448, 449 to write data to an SRAM cell of an SRAM array 310, 400, as described in greater detail below.

In the illustrated embodiment, the SRAM array 400 includes precharge circuitry 430, 432 and cross-coupling circuitry 431, 433 across each respective pair of bit line nodes 422, 423, 424, 425. During operation, the access controller 306 asserts or otherwise provides a logical low voltage signal to a node 446 coupled to the inputs of the precharge circuitry 430, 432 to restore the voltages of the bit line nodes 422, 423, 424, 425 to a logical high voltage value before and/or after each read or write operation performed by the SRAM array 400. The cross-coupling circuitry 431, 433 is configured to hold the voltage at one bit line node of each pair of bit line nodes 422, 423, 424, 425 to a logical high voltage value during a read or write operation to provide better stability, as will be appreciated in the art.

In an exemplary embodiment, the sense amplifier circuitry 418 is realized as a full-swing sense amplifier configured to provide an output voltage indicative of an output data bit value (e.g., a voltage indicative of a particular logic level) at output node 460 that is influenced by an input voltage at its input, that is, the input voltage at the sense amplifier multiplexing input node 464. The input voltage at the multiplexing input node 464 is indicative of or otherwise corresponds to a stored (or previously written) data bit value of an SRAM cell of the SRAM array 400 that is being read from, as described in greater detail below. In an exemplary embodiment, the sense amplifier circuitry 418 includes a precharge transistor 462 configured to precharge the sense amplifier multiplexing input node 464 of the sense amplifier circuitry 418 to a logical high voltage in response to a precharge signal from the access controller 306 at the control terminal of the transistor 462 before reading data from the SRAM array 400. The sense amplifier circuitry 418 also includes an inverter 466 coupled between the sense amplifier multiplexing input node 464 and a control terminal of a second transistor 468, such that the sense amplifier multiplexing input node 464 is maintained at its precharge value in the absence of the read column selection circuitry 410, 412 being selected, activated, or otherwise enabled. A second inverter 470 is coupled between the sense amplifier multiplexing input node 464 and the control (or gate) terminal of an output transistor 472 that controls the output voltage, and thereby, the output data bit value at output node 460. Thus, when a bit line complement value at a bit line complement node 423, 425 corresponds to a logical low voltage and its associated read transistor 410, 412 is turned on, the sense amplifier multiplexing input node 464 is pulled down to the logical low voltage value, which, in turn, turns on the output transistor 472 to produce a logical low voltage value at the output node 460 or otherwise discharge a precharged voltage at the output node 460, thereby indicating that the bit line complement value for the selected word line in the selected column is a logical '0' and the bit line true for the selected word line in the selected column is a logical '1'. Conversely, when a bit line complement value at a bit line complement node 423, 425 corresponds to a logical high voltage and its associated read transistor 410, 412 is turned on, the sense amplifier multiplexing input node 464 is held to the logical high voltage value by the inverter 466 and transistor 468, which, in turn, maintains the output transistor 472 in a turned off state to maintain the precharged voltage at the output node 460, thereby indicating that the bit line complement value for the selected word line in the selected column is a logical '1' and the bit line true for the selected word line in the selected column is a logical '0'.

Figure 5:
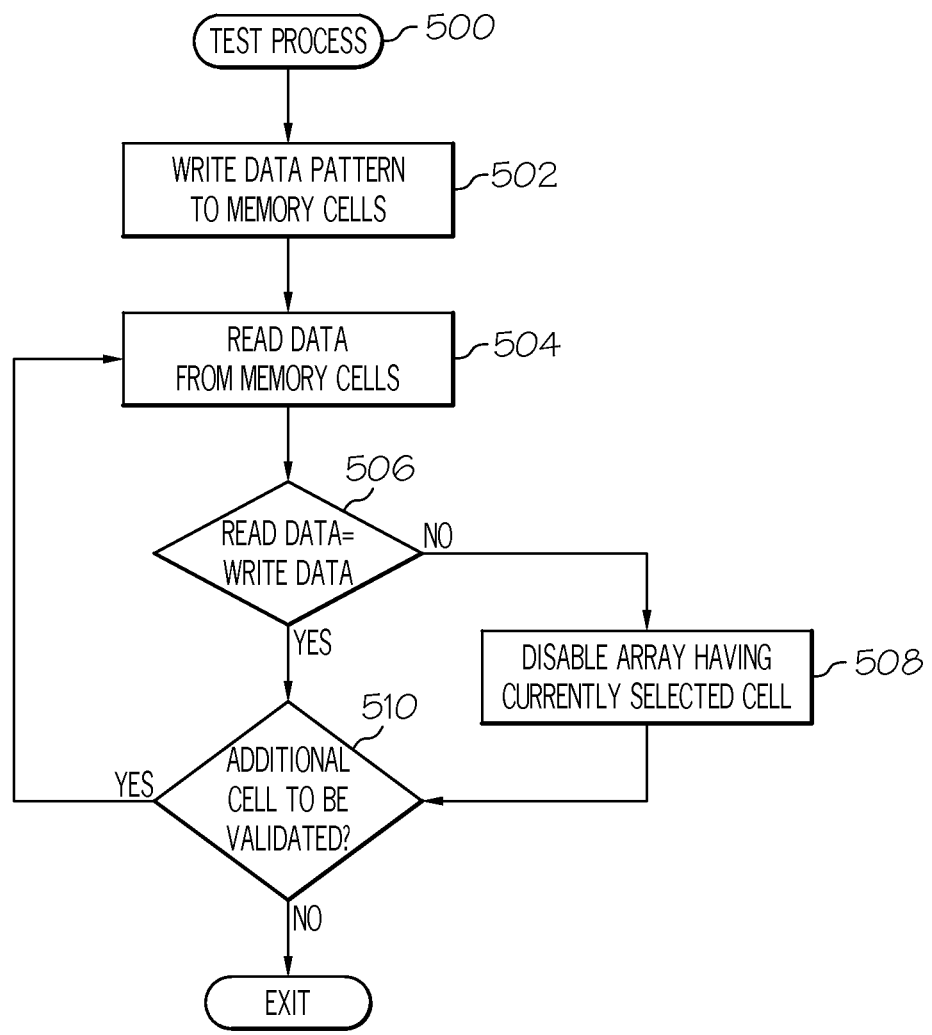
FIG. 5 is a test process suitable for use with the computing system of FIG. 1 in accordance with one or more embodiments.

Referring now to FIG. 5, in an exemplary embodiment, a computing module 106 may be configured to perform a test process 500 and additional tasks, functions, and/or operations as described below. The various tasks may be performed by software, hardware, firmware, or any combination thereof. For illustrative purposes, the following description may refer to elements mentioned above in connection with FIGS. 1-4.

In practice, the tasks, functions, and operations may be performed by different elements of the described system, such as the memory controller 108, test control module 128, caches 110, 112, 114, 116, 118, 200, the tag macro 202, way 300, word line decoders 304, access controllers 306, column selection circuitry 406, 408, 410, 412, write driver circuitry 414, 416, and/or sense amplifier circuitry 418. It should be appreciated any number of additional or alternative tasks may be included, and may be incorporated into a more comprehensive procedure or process having additional functionality not described in detail herein.

Referring to FIG. 5, and with continued reference to FIGS. 1-4, the test process 500 may be performed to enable the computing module 106 to test the components of the SRAM arrays 302 (e.g., the SRAM cells, the column selection circuitry, the write driver circuitry, the sense amplifier circuitry) of the ways 300 in the tag macro 202 of the L3 cache 110. In an exemplary embodiment, the test process 500 initializes or otherwise begins in response to the test control module 128 being indicated of or otherwise identifying a desire to enter a test mode. In this regard, the test control module 128 may identify a desired test mode based on signals and/or bits provided to the test interface 130 that indicate the computing module 106 should implement a particular testing procedure (e.g., a built-in self test). In response to identifying the desired test mode based on the inputs at interface 130, the test control module 128 provides instructions or otherwise signals the memory controller 108 and L3 cache 110 to go into the identified test mode. In an exemplary embodiment, the test control module 128 also provides configuration bits to the access controllers 306 of the ways 300 of the tag macros 202 that cause the access controllers 306 to generate column select signals in a manner that results in column select transistors of multiple instances of column selection circuitry 406, 408, 410, 412 being concurrently activated, turned on or otherwise enabled, as described in greater detail below. In accordance with one embodiment, the column select signals generated by the access controllers 306 in the test mode enable the column selection circuitry corresponding to the memory cell and/or address being accessed (read from and/or written to) along with the column selection circuitry corresponding to a physically adjacent column of memory cells that is aliased to column including the memory cell being accessed. As set forth above, an aliased column of memory cells should be understood as referring to a column of memory cells having associated column selection circuitry that is controlled and/or operated by the column select signal used to control the column selection circuitry of the addressed column of memory cells for a particular operation.

Referring to FIG. 5, and with continued reference to FIGS. 1-4, in accordance with one embodiment, the test process 500 may be performed to enable the computing module 106 to test the writability of the SRAM arrays 302 of the ways 300 in the tag macro 202 of the L3 cache 110. In such an embodiment, the test process 500 initializes or otherwise begins in response to the test control module 128 being indicated of or otherwise identifying a desire to enter a write test mode. In response to identifying the write test mode, the test control module 128 provides instructions or otherwise signals the memory controller 108 and L3 cache 110 to go into the write test mode. In an exemplary embodiment, the memory controller 108 and/or test control module 128 initializes the L3 cache 110 for the write test mode by writing an initialization data pattern into an SRAM array 310, 400 in the tag macro 202. In this regard, the memory controller 108 and/or test control module 128 initializes the L3 cache 110 by writing a particular digital value to each address (i.e., each memory cell) of the SRAM array 310, 400. For example, in some embodiments, the memory controller 108 and/or test control module 128 may initialize the L3 cache 110 for the write test mode by writing a zero value to each memory cell in the SRAM array 310, 400. In other embodiments, the memory controller 108 and/or test control module 128 may write another data pattern (e.g., a checkerboard or striped data pattern) to the SRAM array 310, 400. It will be appreciated that the data previously stored by a respective SRAM cell influences the subsequent writability of that respective SRAM cell. For example, if an SRAM cell is storing a logical '1', it is more difficult to subsequently write a logical '0' to that SRAM cell, and conversely, if an SRAM cell is storing a logical '0', it is more difficult to subsequently write a logical '1' to that SRAM cell. In this manner, the data pattern that the SRAM array 310, 400 is initialized with is capable of increasing and/or decreasing the capacitive load at nodes 440, 441, that is, the input capacitance seen by the write driver circuitry 414, 416, as described in greater detail below.

After initializing the components of the computing module 106 in response to identifying the write test mode, the test process 500 continues by writing a test pattern of data to the memory cells of an array of memory cells in a way of the tag macro while concurrently selecting multiple columns of the array (task 502). In this regard, the test process 500 attempts to write the same digital value to more than one SRAM cell of an array of SRAM cells 400 during each write cycle. The memory controller 108 and/or test control module 128 provides a particular test data pattern to the data input nodes 448, 449, and provides a write instruction along with corresponding addressing information (e.g., identification of the row and column of a particular SRAM array 302, 400 that each data bit is intended to be written to) to the word line decoders 304 and the access controllers 306. For example, to write a data value to an SRAM cell in the first column of SRAM cells 402 coupled to column selection circuitry 406, the memory controller 108 and/or test control module 128 provides voltages indicative of the desired data bit value for the SRAM cell and its complementary value to the data input nodes 448, 449, resulting voltage indicative of the desired data bit value at node 440 and voltage indicative of the complementary value at node 441. To write data to an SRAM cell in the first column 402, the access controller 306 asserts or otherwise provides a logical low read enable signal to the control terminals of transistors 450, 451 to enable the functionality of the write driver circuitry 414, 416 and asserts or otherwise provides a logical high column select signal at node 442 to turn on or otherwise enable transistors 426, 428 and provide the voltages at nodes 440, 441 to the bit line nodes 422, 423 for the first column 402. In the write test mode, the access controller 306 also concurrently asserts or otherwise provides a logical high column select signal at node 444 to concurrently turn on or otherwise activate transistors 436, 438 to provide the voltages at nodes 440, 441 to the bit line nodes 424, 425 for a second column 404. To write the data from bit line nodes 422, 423, 424, 425 the word line decoder 304 associated with the SRAM array 400 provides signals at node 420 to select or otherwise enable the word line of the appropriate row of SRAM cells (e.g., the word line indicated by the address provided by the memory controller 108 and/or test control module 128 corresponding to the data at nodes 440, 441) to be coupled to the bit line nodes 422, 423 424, 425 to write the data bit values from the bit line nodes 422, 423 to the memory cell in that row of the first column 402 and the data bit values from the bit line nodes 424, 425 to the memory cell in that row of the second column 404.

It should be noted that concurrently enabling the column selection circuitry 406, 408 (e.g., concurrently turning on transistors 426, 428, 436, 438) increases the input capacitance at nodes 440, 441, that is, the input capacitance seen by the write driver circuitry 414, 416. This reduces the ability of the write driver circuitry 414, 416 to discharge one pair of bit line nodes (e.g., either the bit line true nodes 422, 424 or the bit line complement nodes 423, 425) during the write cycle by increasing the amount of time required to discharge the voltage of that pair of bit line nodes via the corresponding pair of transistors (e.g., either transistors 426, 436 or transistors 428, 438). As described above, the cumulative capacitive load seen by the write driver circuitry 414, 416 will vary depending on the initialization data pattern stored by the SRAM cells 402, 404 that was previously written upon initialization of the write test mode.

In an exemplary embodiment, after writing the desired test data pattern to the memory cells inside the ways of the tag macro in the write test mode, the test process 500 continues by reading the stored data pattern from the memory cells inside the ways of the tag macro while selecting individual columns of the array of memory cells (task 504). In this regard, for each SRAM cell inside the tag macro 202 being read from, the memory controller 108 and/or test control module 128 provides a read instruction along with corresponding addressing information (e.g., the row and column of each particular SRAM cell) to the word line decoders 304 and the access controllers 306. In the write test mode, the access controller 306 associated with an SRAM array 400 asserts or otherwise provides an individual column select signal to activate, turn on, or otherwise enable the appropriate read column selection circuitry 410, 412 when reading data bits of the stored data pattern. For example, in response to the address provided by the memory controller 108 and/or test control module 128 indicative of a desire to read a data value from an SRAM cell in the first column 402, the access controller 306 associated with the SRAM array 400 asserts or otherwise provides a logical high column select signal at node 444 to turn on or otherwise enable read column select transistor 410 and thereby allow transistor 474 to influence the voltage at the sense amplifier multiplexing input node 464. In a similar manner as set forth above, the word line decoder 304 associated with the SRAM array 400 provides signals at node 420 to select or otherwise enable the word line of the appropriate row of SRAM cells (e.g., the word line indicated by the address provided by the memory controller 108 and/or test control module 128) to be coupled to the bit line nodes 422, 423. The bit line complement value for the selected cell of the first column 402 is provided to the input of inverter 476 and controls operation of transistor 474 to influence the voltage at the sense amplifier multiplexing input node 464 and produce an output data bit value at output node 460 corresponding to the selected cell of the first column 402. In the write test mode, to read from the first column 402, the access controller 306 concurrently asserts or otherwise provides a logical low column select signal at node 442 while providing the logical high column select signal at node 444 to turn off or otherwise disable read column select transistor 412 to prevent the cell in the second column 404 selected by the word line select signal at node 420 from influencing the voltage at the sense amplifier multiplexing input node 464. The access controller 306 also concurrently asserts or otherwise provides logical high read enable signals to the control terminals of transistors 450, 451 to disable the functionality of the write driver circuitry 414, 416 during the read operation.

In an exemplary embodiment, the test process 500 continues by comparing the read data value for each memory cell to the data value that was intended to be written to that respective memory cell while writing the test data pattern to the memory cells of the tag macro (task 506). In this regard, for each SRAM cell of the tag macro 202, the memory controller 108 and/or test control module 128 compares the data bit value at its respective output node to the data bit value that was intended to be written to that respective SRAM cell. For example, the memory controller 108 and/or test control module 128 may compare the read data bit value from output node 460 for a cell of the first column 402 to the data bit value that was intended to be written to that cell of the column 402 (i.e., the data bit value provided to node 441 when that cell was addressed while writing the test data pattern to the SRAM array 400), that is, the value that was written while concurrently writing to a cell in the second column 404. In response to identifying that the data bit value read from the currently selected SRAM cell does not equal or otherwise match its intended value, the test process 500 continues by disabling the SRAM array 310 of the way 300 that includes the SRAM cell currently being evaluated (task 508). As described above, in an exemplary embodiment, the way 300 includes redundant SRAM arrays 310, such that an SRAM array having one or more SRAM cells with a read data bit value that does not match its intended data bit value may be fused out or otherwise effectively removed from the way 300 (e.g., by operating multiplexers 320 to prevent the output of that SRAM array 310 from being provided to the latching arrangement 330). For example, in some cases, the data bit value in an SRAM cell of an SRAM array 400 may not be equal to its intended value due to that particular SRAM cell being to difficult to write. In other cases, the concurrently enabled write column selection circuitry 406, 408 (e.g., transistors 426, 428, 436, 438) may effectively increase the capacitance at nodes 440, 441 and inhibit the ability of the write driver circuitry 414, 416 from driving the appropriate voltage values to nodes 440, 441 within the write cycle.

When the data bit value read from an SRAM cell is equal to its intended value based on the previously written data pattern, the test process 500 repeats the loop defined by tasks 504, 506, 508 and 510 until all of the SRAM cells have been read from and validated (task 510). For example, after validating a memory cell in the first column 402 of the SRAM array 400, the access controller 306 may assert or otherwise provide a logical high column select signal at node 442 to turn on or otherwise enable read column select transistor 412 and thereby allow transistor 478 to influence the voltage at the sense amplifier multiplexing input node 464 while concurrently asserting a logical low column select signal at node 444 and logical high read enable signals to the control terminals of transistors 450, 451. The word line decoder 304 provides signals at node 420 to select the appropriate word line to be coupled to the bit line nodes 424, 425. The bit line complement value for the selected cell of the second column 404 influences the voltage at the sense amplifier multiplexing input node 464 and produce an output data bit value at output node 460 corresponding to the selected cell of the second column 404, as set forth above. The memory controller 108 and/or test control module 128 may compare the read data bit value from output node 460 for the selected cell of the second column 404 to the data bit value that was intended to be written to that cell of the column 404, that is, the value that was written while concurrently writing to a cell in the first column 402.

After identifying that all of the SRAM cells have been read from and validated, in an exemplary embodiment, for the write test mode, the test process 500 may repeat by reinitializing the SRAM array and writing the opposite data pattern to the SRAM arrays of the ways of the tag macro while activating or otherwise enabling column select transistors of multiple instances of column selection circuitry concurrently (task 502). In this regard, after rewriting the initialization data pattern, the memory controller 108 and/or test control module 128 may write a second test data pattern to the ways 300 of the tag macro 202 corresponding to the inverse or partial inverse of the previously written test data pattern. As set forth above, the test process 500 repeats the steps of reading the data from the SRAM cells, comparing the read data for each SRAM cell to its intended value based on the second test data pattern, and disabling SRAM arrays having SRAM cells that were not properly written to and/or read from (e.g., tasks 504, 506, 508, 510). In an exemplary embodiment, for the write test mode, the test process 500 exits after validating all of the SRAM cells of the tag macro 202 using the opposite test data pattern. In other embodiments, the test process 500 may be repeated using additional test data patterns for the write test mode as desired to satisfy the needs of a particular application.

As noted above, it will be appreciated in the art that the initialization data pattern written to the SRAM array 310, 400 may vary depending on the needs of a particular embodiment to provide a desired capacitive load at nodes 440, 441 when writing test data patterns to the SRAM array 310, 400. In this regard, the initialization data pattern may be configured to either increase/decrease the capacitive load at nodes 440, 441 to control the incidence or frequency of an SRAM array being invalidated, or otherwise control the rate at which SRAM arrays of the way 300 are invalidated. Additionally, although the subject matter is described herein in the context of asserting column selects for two columns of SRAM cells, in practice, the test process 500 may be implemented by writing the test data pattern while concurrently selecting more than two columns of SRAM cells. In other words, the test data pattern may be concurrently written to more than two SRAM cells during each write cycle. In this regard, there are numerous possible combinations of initialization data patterns and numbers of concurrently selected columns that may be chosen to achieve a desired capacitive load at nodes 440, 441 when writing test data patterns to the SRAM array 310, 400 to test the write driver circuitry 414, 416 in the desired manner.

Referring again to FIG. 5, and with continued reference to FIGS. 1-4, in accordance with another embodiment, the test process 500 may be performed to enable the computing module 106 to test the readability of the SRAM arrays 302 of the ways 300 in the tag macro 202 of the L3 cache 110 by testing the hold margin of the sense amplifier circuitry 418, that is, the ability of the inverter 466 and transistor 468 to hold the sense amplifier multiplexing input node 464 to the logical high voltage value and maintain the output transistor 472 in a turned off state. In such an embodiment, the test process 500 initializes or otherwise begins in response to the test control module 128 being indicated of or otherwise identifying a desire to enter a read test mode. In response to identifying the read test mode, the test control module 128 provides instructions or otherwise signals the memory controller 108 and L3 cache 110 to go into the read test mode.

In an exemplary embodiment, the memory controller 108 and/or test control module 128 initializes the L3 cache 110 for the read test mode by writing a zero value to each memory cell of an array of memory cells in a way of the tag macro while individually selecting multiple columns of the array (task 502). In this regard, for each cell of the SRAM array 400, the memory controller 108 and/or test control module 128 provides a logical low voltage to data input nodes 449 and a logical high voltage to data input node 448, and provides a write instruction along with corresponding addressing information to the word line decoders 304 and the access controllers 306. For example, in the read test mode, to write a zero value to an SRAM cell in the first column 402, the access controller 306 asserts or otherwise provides a logical low read enable signal to the control terminals of transistors 450, 451 to enable the functionality of the write driver circuitry 414, 416 and asserts or otherwise provides a logical high column select signal at node 442 to turn on or otherwise enable transistors 426, 428 and provide the logical low voltage at node 440 to bit line node 422 and the logical high voltage at node 441 to bit line node 423. In the read test mode, the access controller 306 also concurrently asserts or otherwise provides a logical low column select signal at node 444 to concurrently turn off or otherwise disable transistors 436, 438. Conversely, to write a zero value to an SRAM cell in the second column 404 in the read test mode, the access controller 306 asserts or otherwise provides a logical high column select signal at node 444 to turn on or otherwise enable transistors 436, 438 and provide the voltages at nodes 440, 441 to the bit line nodes 424, 425 for the second column 404 while concurrently asserting a logical low column select signal at node 442 to concurrently turn off or otherwise disable transistors 426, 428. The word line decoder 304 provides signals at node 420 to select the appropriate word line to be coupled to the bit line nodes, in a similar manner as set forth above.

In an exemplary embodiment, after writing the zero value to each memory cell inside the ways of the tag macro in the read test mode, the test process 500 continues by reading the data pattern from the memory cells inside the ways of the tag macro while concurrently selecting multiple columns of the array of memory cells (task 504). For example, in the read test mode, the access controller 306 asserts or otherwise provides a logical high column select signal at node 444 to turn on or otherwise activate read column select transistor 410 and thereby allow the bit line node 423 to influence the voltage at the sense amplifier multiplexing input node 464 via transistor 474. At the same time, the access controller 306 asserts or otherwise provides a logical high column select signal at node 442 to turn on or otherwise activate read column select transistor 412 while the word line decoder 304 provides signals at node 420 to select or otherwise enable the word line of the appropriate row of SRAM cells (e.g., the word line indicated by the address provided by the memory controller 108 and/or test control module 128) to be coupled to the bit line nodes 422, 423, 424, 425. As set forth above, the access controller 306 also concurrently asserts or otherwise provides logical high read enable signals to the control terminals of transistors 450, 451 to disable the functionality of the write driver circuitry 414, 416 during the read operation.

In an exemplary embodiment, the test process 500 continues by comparing the read data value for each memory cell to the data value that was intended to be written to that respective memory cell while writing the data pattern to the memory cells of the tag macro (task 506). For each SRAM cell of the tag macro 202, the memory controller 108 and/or test control module 128 compares the data bit value at its respective output node to the data bit value that was intended to be written to that respective SRAM cell. In this regard, when a selected cell is storing a zero data bit value, the voltage at the sense amplifier multiplexing input node 464 should not change from its precharged value (e.g., a logical high voltage), and in turn, the voltage at the output node 460 should not change. However, asserting or otherwise toggling multiple logical high column select signals creates additional capacitive coupling on the sense amplifier multiplexing input node 464 that may cause the voltage at the sense amplifier multiplexing input node 464 to change by an amount sufficient enough to produce a change in the output of the inverter 466, thereby turning off the transistor 468, turning on transistor 472, and changing the voltage at the output node 460. Accordingly, the memory controller 108 and/or test control module 128 monitors the voltage at the output node 460 while reading from each memory cell while concurrently selecting multiple columns of memory cells to identify when the data bit value read from a currently selected SRAM cell does not equal or otherwise match its intended value (e.g., by the voltage at the output node 460 changing to a logical low voltage).

In response to identifying that the data bit value read from the currently selected SRAM cell does not equal or otherwise match its intended value, the test process 500 continues by disabling the SRAM array 310 of the way 300 that includes the SRAM cell currently being evaluated (task 508). In this regard, if the capacitive coupling caused by asserting or otherwise toggling multiple logical high column select signals causes the voltage at the sense amplifier multiplexing input node 464 and/or output node 460 to change, then it is more likely that the reliability of the circuitry of the SRAM array 400 may be compromised by component degradation over time, such as, for example, negative bias temperature instability (NBTI). When the data bit value read from an SRAM cell is equal to its intended value (e.g., the voltage at the output node 460 does not change), the test process 500 repeats the loop defined by tasks 504, 506, 508 and 510 until all of the SRAM arrays have been read from and validated (task 510). In this manner, the hold margin for the sense amplifier circuitry 418 may be validated for each respective SRAM array 310, 400.

To briefly summarize, one advantage of the testing process described above is that for write operations in the test mode, the write driver circuitry is effectively weakened, thereby better simulating device degradation and improving test coverage for the write driver circuitry. At the same time, the test coverage for the SRAM cells is maintained by testing the writability and/or readability of the SRAM cells for the given voltage and/or timing margins.

For the sake of brevity, conventional techniques related to integrated circuit design, caching, memory operations, memory controllers, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used in the following description for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element/node/feature is directly joined to (or directly communicates with) another element/node/feature, and not necessarily mechanically. Likewise, unless expressly stated otherwise, "coupled" means that one element/node/feature is directly or indirectly joined to (or directly or indirectly communicates with) another element/node/feature, and not necessarily mechanically. Thus, although the figures may depict one exemplary arrangement of elements, additional intervening elements, devices, features, or components may be present in an embodiment of the depicted subject matter. As used herein, a "node" means any internal or external reference point, connection point, junction, signal line, conductive element, or the like, at which a given signal, logic level, voltage, data pattern, current, or quantity is present.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient and edifying road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A memory element comprising:
   a first array of one or more memory cells coupled to a first bit line node;
   a second array of one or more memory cells coupled to a second bit line node;
   access circuitry for accessing a first memory cell in the first array, the access circuitry comprising write driver circuitry configured to provide a first voltage indicative of a write data bit value at a first node;
   a first transistor including a first terminal coupled to the first node and a second terminal coupled to the first bit line node;
   a second transistor including a third terminal coupled to the first node and a fourth terminal coupled to the second bit line node; and
   a controller coupled to a control terminal of the first transistor and a control terminal of the second transistor, wherein the controller is configured to concurrently activate the first transistor and the second transistor to enable the access circuitry to access the first memory cell by applying a first column select signal to the control terminal of the first transistor to activate the first transistor and concurrently applying a second column select signal to the control terminal of the second transistor to activate the second transistor, wherein concurrently activating the first transistor and the second transistor results in the first voltage at the first bit line node and the second bit line node.

2. The memory element of claim 1, wherein:
   the first array comprises a first column of memory cells for the memory element; and
   the second array comprises a second column of memory cells for the memory element.

3. The memory element of claim 1, wherein the controller is configured to concurrently activate the second transistor while the first transistor is activated in response to receiving addressing information indicative of the first memory cell while in a test mode.

4. The memory element of claim 1, further comprising a word line decoder coupled to the first array and the second array, wherein the word line decoder is configured to select a word line coupled to the first memory cell to write the write data bit value from the first bit line node to the first memory cell.

5. The memory element of claim 4, wherein:
   selecting the word line coupled to the first memory cell results in a stored data bit value for the first memory cell;

the access circuitry further comprises sense amplifier circuitry having an input node and an output node;
a third transistor is configured between the first bit line node and the input node; and
the controller is configured to:
  activate the third transistor to provide a voltage indicative of the stored data bit value for the first memory cell at the input node; and
  validate the first memory cell responsive to a voltage at the output node corresponding to the write data bit value, the voltage at the output node being influenced by the voltage indicative of the stored data bit value for the first memory cell at the input node.

6. A memory element comprising:
a first array of one or more memory cells coupled to a first bit line node;
a second array of one or more memory cells coupled to a second bit line node;
access circuitry for accessing a first memory cell in the first array, the access circuitry including sense amplifier circuitry having an input node;
a first transistor including a first terminal coupled to the input node and a second terminal coupled to the first bit line node;
a second transistor including a third terminal coupled to the input node and a fourth terminal coupled to the second bit line node; and
a controller coupled to a control terminal of the first transistor and a control terminal of the second transistor, wherein the controller is configured to concurrently activate the first transistor and the second transistor to enable the access circuitry to access the first memory cell, wherein concurrently activating the first transistor and the second transistor results in the first bit line node being coupled to the input node via the first transistor and the second bit line node being coupled to the input node via the second transistor.

7. An electronic device comprising:
a memory element including an array of memory cells having a plurality of columns; and
a control module coupled to the memory element, wherein:
  in response to identifying a read test mode, the control module and the memory element are cooperatively configured to:
    write an input data pattern to the array of memory cells;
    read an output data pattern from the array of memory cells, the output data pattern corresponding stored values for the array of memory cells after from writing the input data pattern;
    concurrently select at least two of the plurality of columns while reading each bit of the output data pattern from the array; and
    validate the array responsive to the output data pattern matching the input data pattern; and
  the array of memory cells includes:
    sense amplifier circuitry having an input node and an output node;
    a first transistor coupled to a first column of the plurality of columns and the input node of sense amplifier circuitry;
    a second transistor coupled to a second column of the plurality of columns and the input node of the sense amplifier circuitry; and
    an access controller coupled to the first transistor and the second transistor, the access controller being configured to concurrently activate the first transistor and the second transistor while reading each bit of the output data pattern from the first column at the output node.

8. The electronic device of claim 7, wherein in response to identifying a write test mode, the control module and the memory element are cooperatively configured to:
  write a second input data pattern to the array of memory cells;
  concurrently select at least two of the plurality of columns while writing each bit of the second input data pattern;
  read a second output data pattern from the array of memory cells, the output data pattern corresponding to stored values for the array of memory cells resulting from writing the second input data pattern while at least two of the plurality of columns were concurrently selected; and
  validate the array responsive to the second output data pattern matching the second input data pattern.

9. The electronic device of claim 8, wherein:
the array of memory cells includes write driver circuitry configured to receive the second input data pattern;
the first transistor is configured between the first column of the plurality of columns and the write driver circuitry;
the second transistor is configured between the second column of the plurality of columns and the write driver circuitry; and
the access controller is configured to concurrently activate the first transistor and the second transistor while writing each bit of the second input data pattern to the first column using the write driver circuitry.

10. A method for testing access circuitry of a memory element including an array of memory cells having a first column of memory cells coupled to a first bit line node and a second column of memory cells coupled to a second bit line node, the access circuitry comprising write driver circuitry configured to provide a first voltage indicative of a write data bit value at a first node, the method comprising:
  concurrently selecting the first column of the array and the second column of the array while writing the write data bit value to a first memory cell in the first column of the array, wherein concurrently selecting the first column and the second column comprises:
    applying a first column select signal to a control terminal of a first transistor including a first terminal coupled to the first node and a second terminal coupled to the first bit line node to activate the first transistor; and
    concurrently applying a second column select signal to a control terminal of a second transistor including a third terminal coupled to the first node and a fourth terminal coupled to the second bit line node to concurrently activate the first transistor and the second transistor to enable the access circuitry to access the first memory cell, wherein concurrently activating the first transistor and the second transistor results in the first voltage at the first bit line node and the second bit line node; and
  validating the first memory cell responsive to a stored data value of the first memory cell matching the write data bit value for the first memory cell after writing the input data value to the first memory cell.

11. A memory element comprising:
a first array of one or more memory cells coupled to a first bit line node;
a second array of one or more memory cells coupled to a second bit line node;
access circuitry for accessing a first memory cell in the first array, the access circuitry comprising sense amplifier circuitry having an input node;

a first transistor coupled between the first bit line node and the access circuitry;

a second transistor coupled between the second bit line node and the access circuitry;

a third transistor having a control terminal coupled to the first bit line node;

a fourth transistor having a control terminal coupled to the second bit line node; and a controller coupled to the first transistor and the second transistor, wherein:

the first transistor includes a source/drain terminal coupled to a drain/source terminal of the third transistor, a control terminal coupled to the controller, and a drain/source terminal coupled to the input node;

the second transistor includes a source/drain terminal coupled to a drain/source terminal of the fourth transistor, a control terminal coupled to the controller, and a drain/source terminal coupled to the input node; and the controller is configured to concurrently activate the first transistor and the second transistor to enable the access circuitry to access the first memory cell by concurrently applying a first column select signal to the control terminal of the first transistor and a second column select signal to the control terminal of the second transistor.

* * * * *